(12) United States Patent
Baek

(10) Patent No.: US 11,881,259 B2
(45) Date of Patent: Jan. 23, 2024

(54) NEUROMORPHIC DEVICE AND METHOD OF DRIVING SAME

(71) Applicant: KOREA INSTITUTE OF SCIENCE AND TECHNOLOGY, Seoul (KR)

(72) Inventor: Seung Heon Baek, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 173 days.

(21) Appl. No.: 17/721,037

(22) Filed: Apr. 14, 2022

(65) Prior Publication Data

US 2023/0139942 A1    May 4, 2023

(30) Foreign Application Priority Data

Nov. 1, 2021  (KR) .......................... 10-2021-0147600

(51) Int. Cl.
*G11C 11/54* (2006.01)
*G11C 11/18* (2006.01)
*G11C 11/16* (2006.01)

(52) U.S. Cl.
CPC .......... *G11C 11/54* (2013.01); *G11C 11/1673* (2013.01); *G11C 11/1675* (2013.01); *G11C 11/18* (2013.01)

(58) Field of Classification Search
CPC . G11C 11/54; G11C 11/1673; G11C 11/1675; G11C 11/18; G11C 11/161; G11C 11/1659; G06N 3/049; G06N 3/063; G06N 3/065; H10B 61/20; H10N 50/10
USPC .......................................................... 365/158
See application file for complete search history.

(56) References Cited

U.S. PATENT DOCUMENTS

| | | | |
|---|---|---|---|
| 2005/0237788 A1* | 10/2005 | Kano | G11C 11/16 365/158 |
| 2019/0272870 A1* | 9/2019 | Choi | G11C 11/54 |
| 2022/0293678 A1* | 9/2022 | Ueda | G11C 11/1673 |
| 2023/0065198 A1* | 3/2023 | Young | G11C 11/1675 |

* cited by examiner

*Primary Examiner* — Huan Hoang
*Assistant Examiner* — Minh Dinh
(74) *Attorney, Agent, or Firm* — MARSHALL, GERSTEIN & BORUN LLP

(57) ABSTRACT

A neuromorphic device including an electrode including a first terminal connected to a bit line through a write drive transistor and a second terminal connected to a source line, a plurality of unit weighting elements having different resistance values, each of the unit weighting elements including a free layer arranged on the top of the electrode, a tunnel barrier layer arranged on the top of the free layer, and a fixed layer arranged on the top of the tunnel barrier layer, and corresponding to each bit of a synapse weight, and a plurality of control electrodes connected to the bit line through a plurality of read drive transistors, respectively, a control voltage being applied between the free layer and the fixed layer of each of the plurality of unit weighting elements through each of the plurality of control electrodes.

12 Claims, 11 Drawing Sheets

$S3 = \pi ab$ $a'b' = 2ab$ $S4 = 2S3$

| RT1 | RT2 | RT3 | RT4 | 112a | 112b | 112c | 112d | 112a | 112b | 112c | 112d |
|---|---|---|---|---|---|---|---|---|---|---|---|
| ON | OFF | OFF | OFF | P | AP | AP | AP | 1 | 0 | 0 | 0 |
| OFF | ON | OFF | OFF | AP | P | AP | AP | 0 | 1 | 0 | 0 |
| OFF | OFF | ON | OFF | AP | AP | P | AP | 0 | 0 | 1 | 0 |
| OFF | OFF | OFF | ON | AP | AP | AP | P | 0 | 0 | 0 | 1 |
| ON | ON | OFF | OFF | P | P | AP | AP | 1 | 1 | 0 | 0 |
| ON | OFF | ON | OFF | P | AP | P | AP | 1 | 0 | 1 | 0 |
| ON | OFF | OFF | ON | P | AP | AP | P | 1 | 0 | 0 | 1 |
| OFF | ON | ON | OFF | AP | P | P | AP | 0 | 1 | 1 | 0 |
| OFF | ON | OFF | ON | AP | P | AP | P | 0 | 1 | 0 | 1 |
| OFF | OFF | ON | ON | AP | AP | P | P | 0 | 0 | 1 | 1 |
| ON | ON | ON | OFF | P | P | P | AP | 1 | 1 | 1 | 0 |
| ON | ON | OFF | ON | P | P | AP | P | 1 | 1 | 0 | 1 |
| ON | OFF | ON | ON | P | AP | P | P | 1 | 0 | 1 | 1 |
| OFF | ON | ON | ON | AP | P | P | P | 0 | 1 | 1 | 1 |
| ON | ON | ON | ON | P | P | P | P | 1 | 1 | 1 | 1 |
| OFF | OFF | OFF | OFF | AP | AP | AP | AP | 0 | 0 | 0 | 0 |

| RT1 | RT2 | RT3 | RT4 | 112a | 112b | 112c | 112d | 112a | 112b | 112c | 112d |
|---|---|---|---|---|---|---|---|---|---|---|---|
| ON | OFF | OFF | OFF | AP | P | P | P | 0 | 1 | 1 | 1 |
| OFF | ON | OFF | OFF | P | AP | P | P | 1 | 0 | 1 | 1 |
| OFF | OFF | ON | OFF | P | P | AP | P | 1 | 1 | 0 | 1 |
| OFF | OFF | OFF | ON | P | P | P | AP | 1 | 1 | 1 | 0 |
| ON | ON | OFF | OFF | AP | AP | P | P | 0 | 0 | 1 | 1 |
| ON | OFF | ON | OFF | AP | P | AP | P | 0 | 1 | 0 | 1 |
| ON | OFF | OFF | ON | AP | P | P | AP | 0 | 1 | 1 | 0 |
| OFF | ON | ON | OFF | P | AP | AP | P | 1 | 0 | 0 | 1 |
| OFF | ON | OFF | ON | P | AP | P | AP | 1 | 0 | 1 | 0 |
| OFF | OFF | ON | ON | P | P | AP | AP | 1 | 1 | 0 | 0 |
| ON | ON | ON | OFF | AP | AP | AP | P | 0 | 0 | 0 | 1 |
| ON | ON | OFF | ON | AP | AP | P | AP | 0 | 0 | 1 | 0 |
| ON | OFF | ON | ON | AP | P | AP | AP | 0 | 1 | 0 | 0 |
| OFF | ON | ON | ON | P | AP | AP | AP | 1 | 0 | 0 | 0 |
| ON | ON | ON | ON | AP | AP | AP | AP | 0 | 0 | 0 | 0 |
| OFF | OFF | OFF | OFF | P | P | P | P | 1 | 1 | 1 | 1 |

FIG. 5

| 112a | 112b | 112c | 112d | 112a | 112b | 112c | 112d | TOTAL OF AMOUNTS OF CURRENT |
|---|---|---|---|---|---|---|---|---|
| AP | AP | AP | AP | 0 | 0 | 0 | 0 | $\frac{15 + 0 \times TMR}{8R \times (1 + TMR)}$ |
| AP | AP | AP | P | 0 | 0 | 0 | 1 | $\frac{15 + 1 \times TMR}{8R \times (1 + TMR)}$ |
| AP | AP | P | AP | 0 | 0 | 1 | 0 | $\frac{15 + 2 \times TMR}{8R \times (1 + TMR)}$ |
| AP | AP | P | P | 0 | 0 | 1 | 1 | $\frac{15 + 3 \times TMR}{8R \times (1 + TMR)}$ |
| AP | P | AP | AP | 0 | 1 | 0 | 0 | $\frac{15 + 4 \times TMR}{8R \times (1 + TMR)}$ |
| AP | P | AP | P | 0 | 1 | 0 | 1 | $\frac{15 + 5 \times TMR}{8R \times (1 + TMR)}$ |
| AP | P | P | AP | 0 | 1 | 1 | 0 | $\frac{15 + 6 \times TMR}{8R \times (1 + TMR)}$ |
| AP | P | P | P | 0 | 1 | 1 | 1 | $\frac{15 + 7 \times TMR}{8R \times (1 + TMR)}$ |
| P | AP | AP | AP | 1 | 0 | 0 | 0 | $\frac{15 + 8 \times TMR}{8R \times (1 + TMR)}$ |
| P | AP | AP | P | 1 | 0 | 0 | 1 | $\frac{15 + 9 \times TMR}{8R \times (1 + TMR)}$ |
| P | AP | P | AP | 1 | 0 | 1 | 0 | $\frac{15 + 10 \times TMR}{8R \times (1 + TMR)}$ |
| P | AP | P | P | 1 | 0 | 1 | 1 | $\frac{15 + 11 \times TMR}{8R \times (1 + TMR)}$ |
| P | P | AP | AP | 1 | 1 | 0 | 0 | $\frac{15 + 12 \times TMR}{8R \times (1 + TMR)}$ |
| P | P | AP | P | 1 | 1 | 0 | 1 | $\frac{15 + 13 \times TMR}{8R \times (1 + TMR)}$ |
| P | P | P | AP | 1 | 1 | 1 | 0 | $\frac{15 + 14 \times TMR}{8R \times (1 + TMR)}$ |
| P | P | P | P | 1 | 1 | 1 | 1 | $\frac{15 + 15 \times TMR}{8R \times (1 + TMR)}$ |

NEUROMORPHIC DEVICE AND METHOD OF DRIVING SAME

STATEMENT OF GOVERNMENTAL SUPPORT

This invention was made with government support under Korea Institute of Science and Technology (KIST) institutional program (2E31541; contribution ratio of 1/2) and the National Research Foundation of Korea (NRF) program (2020M3F3A2A01081635; contribution ratio of 1/2) funded by Ministry of Science and ICT. The supervising institute was KOREA INSTITUTE OF SCIENCE AND TECHNOLOGY.

CROSS REFERENCE TO RELATED APPLICATION

The present application claims priority to Korean Patent Application No. 10-2021-147600, filed Nov. 1, 2021, the entire content of which is incorporated herein for all purposes by this reference.

BACKGROUND

Field of the Invention

The present disclosure relates to a neuromorphic device and a method of driving the neuromorphic device and, more particularly, to a neuromorphic device capable of storing data by selecting each bit of a synapse weight and of improving the integration density and a method of driving the neuromorphic device.

Description of the Related Art

In recent years, semiconductor elements in various forms have been under development in order to overcome limitations of computers based on the Von Neumann architecture. In the Von Neumann architecture, computing operations are performed by a fast-operating central processing unit (CPU). The CPU, usually referred to as a processor for short, is currently used as a device essential for the Von Neumann architecture. When the CPU processes a lot of data such as during big data analysis or in an artificial intelligence system, much time and energy are consumed for data fetching between a memory and the processor, thereby decreasing overall system performance.

Accordingly, methods of decreasing the time taken for the data fetching between the memory and the processor using a hardware accelerator, such as a graphics processing unit (GPU) or a tensor processing unit (TPU), have been developed. The GPU, the TPU, and the like are CMOS-based auxiliary processors and are specialized for parallel arithmetic processing. The hardware accelerator can be arranged adjacent to the memory to reduce the time taken for the data fetching. However, the data fetching is ultimately necessary. Thus, there is a limitation of the hardware accelerator in overcoming a decrease in system performance.

Brain-imitating semiconductor elements have been under development to overcome the limitation. The brain-imitating semiconductor element performs computing operations using digital/analog elements imitating neurons and synapses in the human brain. The brain-imitating semiconductor element employs a computing method typical of the non-Von Neumann architecture. The brain-imitating semiconductor element can greatly decrease energy consumption and at the same time is capable of performing a wide range of processing, such as recognition, learning, and decision making. Currently, as the brain-imitating semiconductor element, a processing-in-memory (PIM) element that serves to perform both a memory function and a processor function of performing an arithmetic operation is widely used.

A primary function of a neuron is to generate electrical spikes and transmit information to another neuron when receiving stimuli at or above a threshold. An electrical signal generated in this manner is called action potential. A neuron is broadly divided into three regions, that is, a soma, a dendrite, and an axon. The soma has a nucleus, the dendrite receives signals from other neurons, and the axon carries signals to other neurons. A synapse serving to transfer the signal is present between the dendrite and the axon.

The synapse has a weighting value and indicates the degree of connection between neurons. A signal can be further amplified or suppressed according to the weighting value. That is, the synapse serves to store information according to its weight and at the same time to process a signal. A memory is necessary to store the weighting value of the synapse.

In recent years, a next-generation memory device, such as Resistive Random Access Memory (RRAM), Magnetic Random Access Memory (MRAM), or Phase Change Memory (PCM), has been realized as a cross-point array, and thus methods of storing the weighting value of the synapse have been under development. The cross-point array is configured to include a plurality of input terminals and a plurality of output terminals, and has a structure in which a unit cell is positioned at points where the input terminals intersect the output terminals, respectively. The cross-point array is capable of performing an arithmetic operation. A memory in the cross-point array occupies a small area. The cross point array has the advantage of achieving low power consumption.

An ideal synapse for imitating the human brain needs to experience an analogic weight change in a linear manner. Currently, a digital device uses the binary notation of 0's and 1's. Thus, there is a limitation in expressing an analogic weight varying between 0 and 1. Therefore, in order to cause the analogic weight change, there is a need to develop a device having multi-level characteristics and being capable of storing a plurality of levels.

The foregoing is intended merely to aid in the understanding of the background of the present disclosure, and is not intended to mean that the present disclosure falls within the purview of the related art that is already known to those skilled in the art.

SUMMARY OF THE INVENTION

An objective of the present disclosure is to provide a neuromorphic device capable of storing data by selecting each bit of a synapse weight and of improving the integration density and a method of driving the neuromorphic device.

According to an aspect of the present disclosure, there is provided a neuromorphic device including: an electrode including a first terminal connected to a bit line through a write drive transistor and a second terminal connected to a source line; a plurality of unit weighting elements having different resistance values, each of the plurality of unit weighting elements including a free layer arranged on the top of the electrode, a tunnel barrier layer arranged on the top of the free layer, and a fixed layer arranged on the top of the tunnel barrier layer, and corresponding to each bit of a synapse weight; and a plurality of control electrodes connected to the bit line through a plurality of read drive transistors, respectively, a control voltage being applied between the free layer and the fixed layer of each of the plurality of unit weighting elements through each of the plurality of control electrodes.

According to another aspect of the present disclosure, there is provided a method of driving a neuromorphic device, the method including: applying write current to an electrode; applying a control voltage to at least one selected from among a plurality of control electrodes and thus changing a value of switching threshold current of a unit weight element; and changing a magnetization direction of a free layer of the unit weighting element, a value of whose switching threshold current is changed due to write current.

The disclosed technology has the following effect. In addition, a specific implementation example of the neuromorphic device is not meant to be acquired to achieve all the following effects or only the following effects and therefore should not be understood as imposing any limitation on the claimed scope of the present disclosure.

The neuromorphic device and the method of driving the neuromorphic device according to the embodiments of the present disclosure can store data by selecting each bit of a synapse weight and can improve the integration density.

BRIEF DESCRIPTION OF THE DRAWINGS

The above and other objectives, features, and other advantages of the present disclosure will be more clearly understood from the following detailed description when taken in conjunction with the accompanying drawings, in which:

FIGS. 3A to 3D are diagrams necessary to describe write operation of each of the first to fourth unit weighting elements illustrated in FIG. 1;

FIGS. 4 and 5 are diagrams necessary to describe read operation of each of the first to fourth unit weighting elements illustrated in FIG. 1;

DETAILED DESCRIPTION OF THE DRAWINGS

Figure 1:
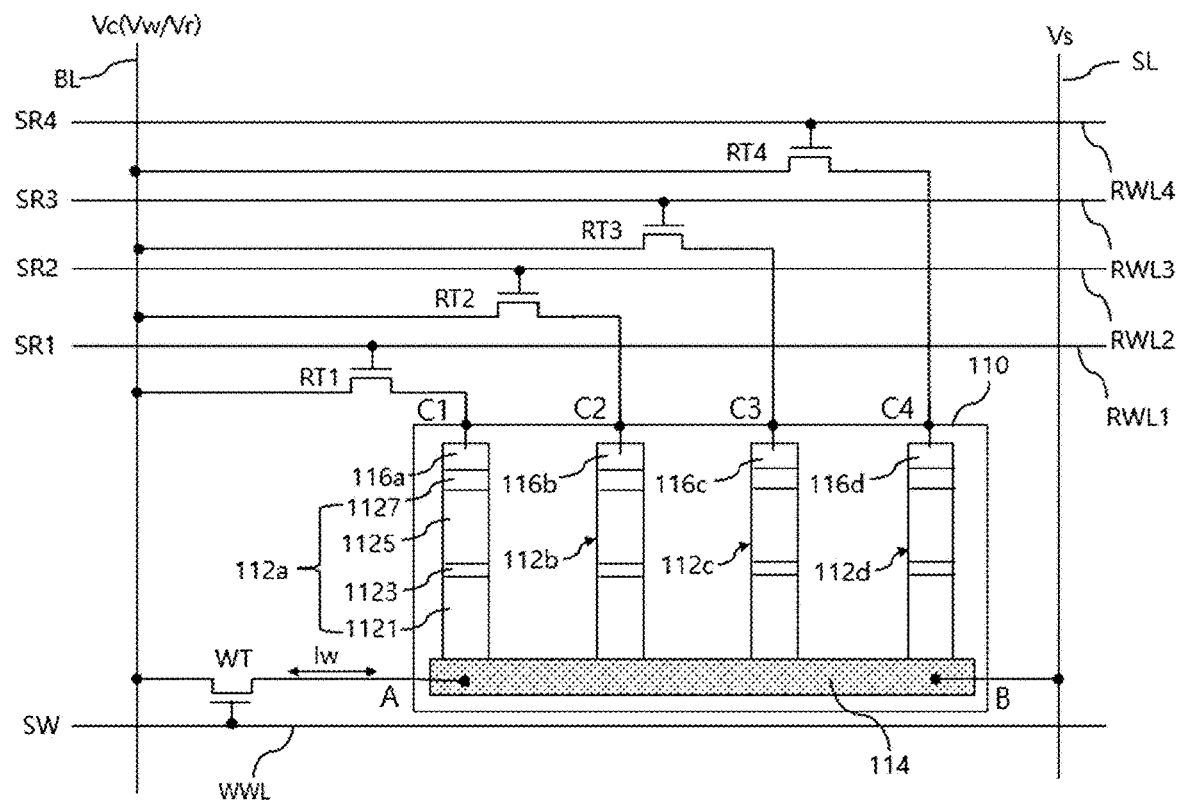
FIG. 1 is a diagram illustrating a neuromorphic device according to a first embodiment of the present disclosure.

An embodiment of the present disclosure will be described below in an exemplary manner in terms of structures and functions. Therefore, the claimed scope of the present disclosure should not be construed as being limited by the embodiment of the present disclosure. That is, various modifications can be made to the embodiment, and the embodiment can take various forms. Therefore, equivalents of the embodiment that can realize the technical idea of the present disclosure should be understood as falling within the scope of the present disclosure. In addition, a specific embodiment is not meant to be required to achieve all the objectives of the present disclosure or all the effects thereof or to achieve only all the effects, and therefore should not be understood as imposing any limitation on the claimed scope of the present disclosure.

The terms used through the present application should be understood as having the following meanings.

The terms "first", "second", and so on are intended to distinguish among constituent elements and therefore should not be construed as imposing any limitation on the claimed scope of the present disclosure. For example, a first constituent element may be named a second constituent element. In the same manner, the second constituent element may also be named the first constituent element.

A constituent element, when described as being "connected to" a different constituent element, should be understood as being connected directly to the different constituent element or as being connected to the different constituent element with a third intervening constituent element interposed therebetween. By contrast, a constituent element, when described as being "connected directly to" a different constituent element, should be understood as being connected to the different constituent element without any third intervening constituent element interposed therebetween. Expressions such as "between" and "directly between" and expressions such as "adjacent to" and "directly adjacent to" that are used to describe a relationship between constituent elements should also be construed in the same manner.

The term used in the present specification, although expressed in the singular, is construed to have a plural meaning, unless otherwise explicitly meant in context. It should be understood that the terms "include", "have", and the like are intended to indicate that a feature, a number, a step, an operation, a constituent element, a component, or any combination thereof is present, without precluding the possible presence or addition of one or more other features, numbers, steps, operations, constituent elements, or any combination thereof.

Identification characters (for example, a, b, c, and so forth) are assigned to steps for convenience of description. The identification characters do not indicate the order of steps. Unless otherwise stated in context, steps may be performed in a different order than in the mentioned order. That is, steps may be performed in the mentioned order. Steps may be performed substantially at the same time and may be performed in reverse order.

Unless otherwise defined, each of all terms used throughout the present specification has the same meaning as is normally understood by a person of ordinary skill in the art to which the present disclosure pertains. A term as defined in a commonly used dictionary should be construed as having the same meaning as that in context in the related art and, unless otherwise explicitly defined in the present application, should not be construed as having an excessively implied meaning or a purely literal meaning.

FIG. 1 is a diagram illustrating a neuromorphic device according to a first embodiment of the present disclosure.

With reference to FIG. 1, a neuromorphic device 100 according to the first embodiment of the present disclosure is an MRAM device. The neuromorphic device 100 may include a bit line BL, a write word line WWL, first to fourth read word lines RWL1 to RWL4, a source line SL, a write drive transistor WT, first to fourth read drive transistors RT1 to RT4, and a synapse weighting element 110.

The bit line BL here may be arranged in a manner that intersects the write word line WWL and each of the first to fourth read word lines RWL1 to RWL4. The source line SL may be arranged in parallel with the bit line BL.

The write drive transistor WT is connected between the bit line BL and the first terminal A of the synapse weighting element 110, and a gate of the write drive transistor WT is connected to the write word line WWL. The write drive transistor WT may be formed as an NMOS transistor.

The first to fourth read drive transistors RT1 to RT4 are connected between the bit line BL and a third terminal C1 of the synapse weighting element 110, between the bit line BL and a second terminal C2 thereof, between the bit line BL and a third terminal C3 thereof, and between the bit line BL and a fourth terminal C4 thereof. Gates of the first to fourth read drive transistors RT1 to RT4 are correspondingly connected to the first to fourth read word lines RWL1 to RWL4, respectively. Each of the first to fourth read drive transistors RT1 to RT4 here may be formed as an NMOS transistor.

The synapse weighting element 110 may be arranged in such a manner as to be connected to the bit line BL, the write word line WWL, and the first to fourth read word lines RWL1 to RWL4, and may be electrically connected to the source line SL. The synapse weighting element 110 has the first terminal A, a second terminal B, and the plurality of third terminals C1 to C4. The first terminal A is connected to the bit line BL through the write drive transistor WT, and the second terminal B is connected to the source line SL. The plurality of third terminals C1 to C4 are connected to the bit line BL, through the first to fourth read drive transistors RT1 to RT4, respectively, in a corresponding manner.

Current Iw is applied to the synapse weighting element 110 through the write drive transistor WT. A control voltage Vc is applied to the synapse weighting element 110 through at least one selected from among the first to fourth read drive transistors RT1 to RT4. The synapse weighting element 110 stores a synapse weight on a per-bit basis. At this point, the control voltage Vc at a level corresponding to a write control voltage Vw may be applied during a write operation. The control voltage Vc at a level corresponding to a read control voltage Vr may be applied during a read operation.

The synapse weighting element 110 may include first to fourth unit weighting elements 112a to 112d, an electrode 114, and a plurality of control electrodes 116a to 116d. The first to fourth unit weighting elements 112a to 112d correspond to bits, respectively, of the synapse weight and have different resistance values.

The first embodiment of the present disclosure is described, taking as an example a case where the synapse weight is represented as four-bit data. Accordingly, the synapse weighting element 110 is described as including four unit weighting elements 112a to 112d. However, the first embodiment of the present disclosure is not limited to the four unit weighting elements 112a to 112d. In a case where the synapse weight is represented as n-bit data, the synapse weighting element 110 may include n unit weighting elements.

A resistance ratio between the first to forth unit weighting elements 112a to 112d may be set to $2^n$ times. For example, a resistance ratio among the respective resistance values of the first to fourth unit weighting elements 112a to 112d may be set to $1(=2^0):2(=2^1):4(=2^2):8(=2^3)$. A method of differently setting the respective resistance values of the first to fourth unit weighting elements 112a to 112d is described in detail with reference to FIGS. 2A and 2B.

Among the first to fourth unit weighting elements 112a to 112d, the unit weighting element having the lowest resistance value corresponds to the most significant bit of the synapse weight, and the unit weighting element having the highest resistance value corresponds to the most insignificant bit of the synapse weight. The first embodiment of the present disclosure is described, taking as an example a case where, among the first to fourth unit weighting elements 112a to 112d, the first unit weighting element 112a corresponds to the most significant bit of the synapse weight and where the fourth unit weighting element 112d corresponds to the most insignificant bit of the synapse weight.

Each of the first to fourth unit weighting elements 112a to 112d, as a magnetic tunnel junction structure (hereinafter referred to as an MTJ), may include a free layer 1121, a tunnel barrier layer 1123, a fixed layer 1125, and a capping layer 1127. The free layer 1121 is arranged on the top of the electrode 114 and changes in parallel with or in anti-parallel with a magnetization direction of the fixed layer 1125. The free layer 1121 may contain a ferromagnetic material, for example, any one material selected from the group consisting of Fe, Co, Ni, B, Si, Zr, Pt, Tb, Pd, Cu, W, Ta, and Mn.

The tunnel barrier layer 1123 is arranged on the top of the free layer 1121 and may serve as a tunnel barrier. The tunnel barrier layer 1123 may contain a non-magnetic material, for example, at least one material selected from the group consisting of MgO, MgAlO, MgTiO, $Al_2O_3$, $HfO_2$, $TiO_2$, $Y_2O_3$, and $Yb_2O_3$.

The fixed layer 1125 is arranged on the top of the tunnel barrier layer 1123, and magnetization thereof is directed toward a predetermined fixed direction. The fixed layer 1125 may contain a ferromagnetic material, for example, any one material selected from the group consisting of Fe, Co, Ni, B, Si, Zr, Pt, Tb, Pd, Cu, W, and Ta.

The capping layer 1127 is arranged on the top of the fixed layer 1125 and may serve to prevent the fixed layer 1125 from being oxidized. The capping layer 1127 may be formed as an oxide film. The capping layer 1127 here may contain a metal material. For example, the capping layer 1127 may contain Ta, Ru, W, Mo, Co, Fe, Ni, TiN, CoFe, FeNi, CoNi, CoFeB, CoFeBMo, CoFeBW, or the like.

The electrode 114 includes the first terminal A and the second terminal B. The first terminal A is connected to the bit line BL through the write drive transistor WT, and the second terminal B is connected to the source line SL. Through the electrode 114, current may be supplied to each of the first to fourth unit weighting elements 112a to 112d. The current here may be pin-polarized current for controlling a magnetization direction of the free layer 1121. The electrode 114 may be formed of a heavy metal material. For example, the heavy metal material may contain at least one material selected from the group consisting of Pt, Ni, Mn, Sn, Zn, Ba, Sb, Cd, Bi, V, and Se.

The first to fourth control electrodes 116a to 116d are arranged on the tops, respectively, of the capping layers 1127 of the first to fourth unit weighting elements 112a to 112d and are electrically connected to the third terminals C1 to C4, respectively. The control voltage Vc is applied between the free layer 1121 and the fixed layer 1125 of the first unit weighting element 112a through the first control electrode 116a. The control voltage Vc is applied between the free layer 1121 and the fixed layer 1125 of the second unit weighting element 112b through the second control electrode 116b. The control voltage Vc is applied between the free layer 1121 and the fixed layer 1125 of the third unit weighting element 112c through the third control electrode 116c. The control voltage Vc is applied between the free layer 1121 and the fixed layer 1125 of the fourth unit weighting element 112d through the fourth control electrode 116d.

Figure 2A:
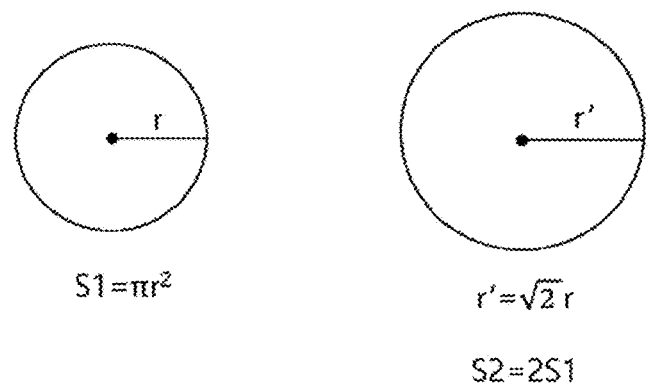
FIGS. 2A and 2B are diagrams necessary to describe a method of differently setting respective resistances of first to fourth unit weighting elements illustrated in FIG. 1.
Figure 2B:
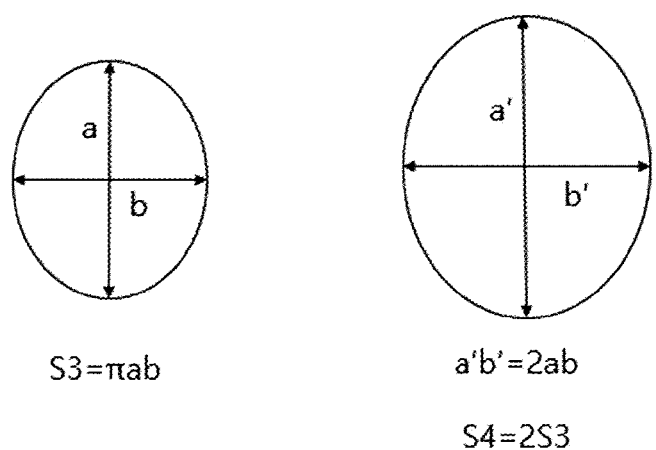

FIGS. 2A and 2B are diagrams necessary to describe the method of differently setting respective resistances of the first to fourth unit weighting elements 112a to 112d illustrated in FIG. 1. With reference to FIG. 2A, in a case where the first to fourth unit weighting elements 112a to 112d each have a circular cross-section, an area of the circular cross-section is in proportion to the square of the radius. The respective resistance values of the first to fourth unit weighting elements 112a to 112d each have to change by a factor of 2 and thus the areas thereof each have to change by a factor of 2. Therefore, when the radius changes by a factor of $\sqrt{2}$, the area changes by a factor of 2. For example, if it is assumed that a radius of the first unit weighting element 112a is r and that an area thereof is S1, when a radius of the second unit weighting element 112b changes from r' to $\sqrt{2}$r, an area S2 thereof increases to two times than the area S1.

By contrast, in a case where the first to fourth unit weighting elements 112a to 112d each have an elliptical cross-section, as illustrated in FIG. 2B, an area of the elliptical cross-section is in proportion to the product of a length of a long axis a and a length of a short axis b. Therefore, when the product of the length of the long axis a and the length of the short axis b increases two times, the resistance value increases two times. The more the areas of the first to fourth unit weighting elements 112a to 112d increase, the more the resistance values decrease. Therefore, among the first to fourth unit weighting elements 112a to 112d, the magnetic tunnel junction structure having the lowest resistance value may be formed in a manner that has the largest area, and the magnetic tunnel junction structure having the highest resistance value may be formed in a manner that has the smallest area. The advantage of this method is that a photolithography process can be performed only one time.

In addition to the method of changing the respective areas of the first to fourth unit weighting elements 112a to 112d, there is a method of changing the resistance value by differently changing the thickness of the tunnel barrier layer 1123. Usually, when the thickness of the tunnel barrier layer 1123 increases, a value of a resistance area (RA), that is, the product of the resistance and the area, exponentially increases. Conversely, when the thickness of the tunnel barrier layer 1123 decreases, the value of the RA exponentially decreases.

That is, the thickness of the tunnel barrier layer 1123 and the value of the RA have a predetermined relationship. Thus, the respective resistance values of the first to fourth unit weighting elements 112a to 112d can increase two times on the basis of this predetermined relationship. The advantage of this method is that the first to fourth unit weighting elements 112a to 112d can be realized in such a manner that the respective areas thereof are the same.

FIGS. 3A to 3D are diagrams necessary to describe write operation of each of the first to fourth unit weighting elements 112a to 112d illustrated in FIG. 1.

Figure 3A:
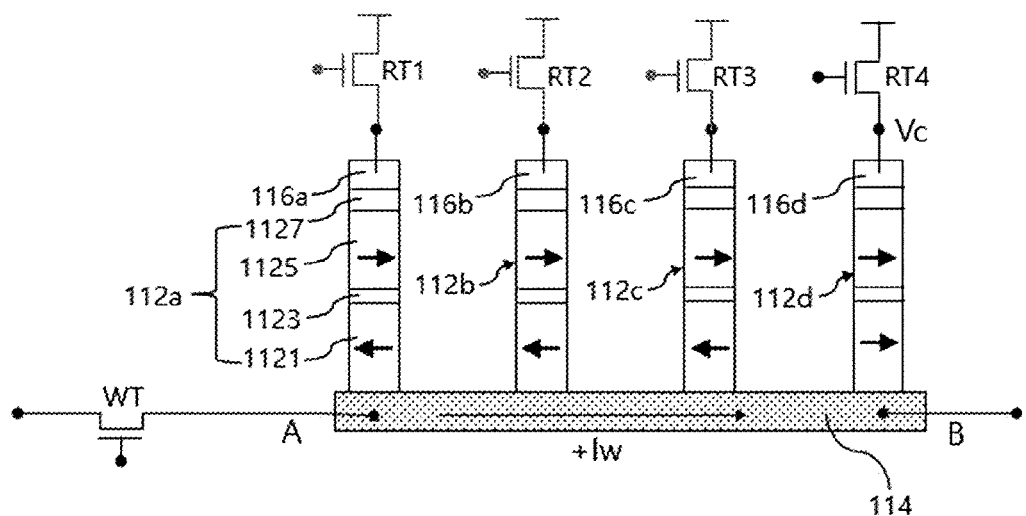

With reference to FIG. 3A, during the write operation, the write drive transistor WT is turned on, and thus the current Iw flows through the electrode 114. At this point, when the write current Iw high enough so that a magnetic property of the free layer 1121 changes does not flow through each of the first to fourth unit weighting elements 112a to 112d, the magnetic property of the free layer 1121 does not change.

In this state, the fourth read drive transistor RT4 is turned on. At this point, the control voltage Vc at a level corresponding to the write control voltage Vw is applied. Then, the write control voltage Vw is applied to the fourth control electrode 114d, and switching threshold current of the fourth unit weighting element 112d is lowered. Usually, in the MTJ, when a voltage having a predetermined magnitude is applied between the free layer 1121 and the fixed layer 1125, magnetic anisotropic energy is lowered. The switching threshold current has a value that is in proportion to the magnetic anisotropic energy due to a voltage-controlled magnetic anisotropy (VCMA) effect. Therefore, when the magnetic anisotropic energy is lowered, the switching threshold current is also lowered.

Therefore, when the write control voltage Vw is applied between the free layer 1121 and the fixed layer 1125 of the fourth unit weighting element 112d, the magnetic anisotropic energy is lowered, and thus the switching threshold current is lowered.

The switching threshold current has a value of current at which the free layer 1121 can be magnetically inverted. Therefore, when the switching threshold current of the fourth unit weighting element 112d is lowered, only the free layer 1121 of the fourth unit weighting element 112d is magnetically inverted. At this point, according to a direction of the write current Iw, the free layer 1121 of the fourth unit weighting element 112d may be switched in a state of being in parallel with or in anti-parallel with the magnetization direction of the fixed layer 1125.

For example, it is assumed that the magnetization directions of the free layers 1121 of the first to fourth unit weighting elements 112a to 112d are all in anti-parallel with the magnetization direction of the fixed layer 1125. In this state, when positive (+) write current +Iw that has the same value as or a higher value than the switching threshold current of the fourth unit weighting element 112d flows in a direction from the first terminal A to the second terminal B, spin-orbit torque occurs in a positive (+) Z-axis direction within the electrode 114. Furthermore, due to the spin-orbit torque, the free layer 1121 of the fourth unit weighting element 112d is magnetically inverted in parallel with the magnetization direction of the fixed layer 1125 (as indicated by arrows).

In the first embodiment of the present disclosure, for example, the magnetic inversion due to the positive (+) write current +Iw is described as changing the magnetization direction from being anti-parallel to being parallel, and magnetic inversion due to negative (−) write current −Iw is described as changing the magnetization direction from being parallel to being anti-parallel. However, the magnetic inversion direction is not limited to being parallel and anti-parallel and may vary with a spin hole angle of a material of which the electrode 114 is formed.

The first to fourth unit weighting elements 112a to 112d, when the magnetization directions of the free layers 1121 and the fixed layers 1125 thereof are anti-parallel (AP), are in a high resistance state, and thus the lowest current flows. The first to fourth unit weighting elements 112a to 112d, when the magnetization directions of the free layers 1121 and the fixed layers 1125 thereof are parallel (P), are in a low resistance state, and thus the highest current flows.

Accordingly, for description of the first embodiment of the present disclosure, by definition, when the first to fourth unit weighting elements 112a to 112d each are in an anti-parallel state, a data of 0 is stored, and when the first to fourth unit weighting elements 112a to 112d each are in a parallel state, a data of 1 is stored. Therefore, when the free layer 1121 of the fourth unit weighting element 112d is magnetically inverted in a parallel manner, the synapse weight may be stored as "0001".

Figures 3B, 3C:
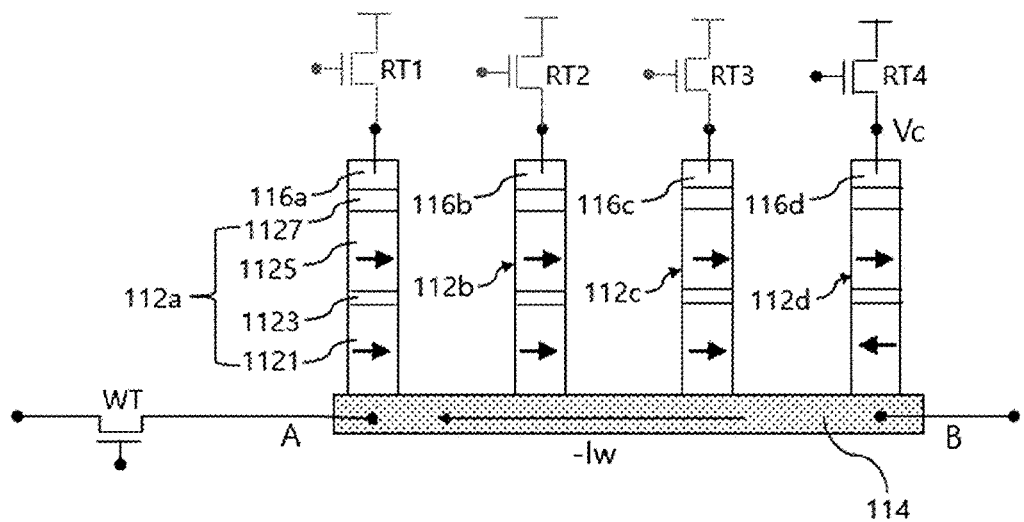

In this manner, the synapse weight is stored as follows. The magnetization directions of the free layers 1121 of the first to fourth unit weighting elements 112a to 112d are all in anti-parallel with the magnetization direction of the fixed layer 1125. In this state, when the control voltage Vc at a level corresponding to the write control voltage Vw is applied through the read drive transistor selected from among the first to fourth read drive transistors RT1 to RT4, the switching threshold current of the corresponding unit weighting element is lowered, and due to the write current Iw, the free layer 1121 of the corresponding unit weighting element switches to a state of being in parallel with the magnetization direction of the fixed layer 1125. Therefore, as illustrated in FIG. 3B, the synapse weight may be stored in such a manner as to have one of 16 levels ranging from "0000" to "1111".

The opposite case is described. With reference to FIG. 3C, the magnetization direction of the free layers 1121 is in parallel with the magnetization direction of the fixed layer 1125. In this state, when the negative (−) write current −Iw that has the same value as or a higher value than the switching threshold current of the fourth unit weighting element 112d flows in a direction from the second terminal B to the first terminal A, the spin-orbit torque occurs in a negative (−) Z-axis direction within the electrode 114. Furthermore, due to the spin-orbit torque, the free layer 1121 of the fourth unit weighting element 112d is magnetically inverted in anti-parallel with the magnetization direction of the fixed layer 1125. Therefore, the synapse weight may be stored as "1110".

In this manner, the synapse weight is stored as follows. The magnetization directions of the free layers 1121 of the first to fourth unit weighting elements 112a to 112d are all in parallel with the magnetization direction of the fixed layer 1125. In this state, when the control voltage Vc at a level corresponding to the write control voltage Vw is applied through the read drive transistor selected from among the first to fourth read drive transistors RT1 to RT4, the switching threshold current of the corresponding unit weighting element is lowered, and due to the write current Iw, the free layer 1121 of the corresponding unit weighting element switches to a state of being in anti-parallel with the magnetization direction of the fixed layer 1125. Therefore, as illustrated in FIG. 3D, one of 16 levels ranging from "1111" to "0000" may be assigned to the synapse weight, and the synapse weight may be stored according to its level.

Figures 3D, 4:
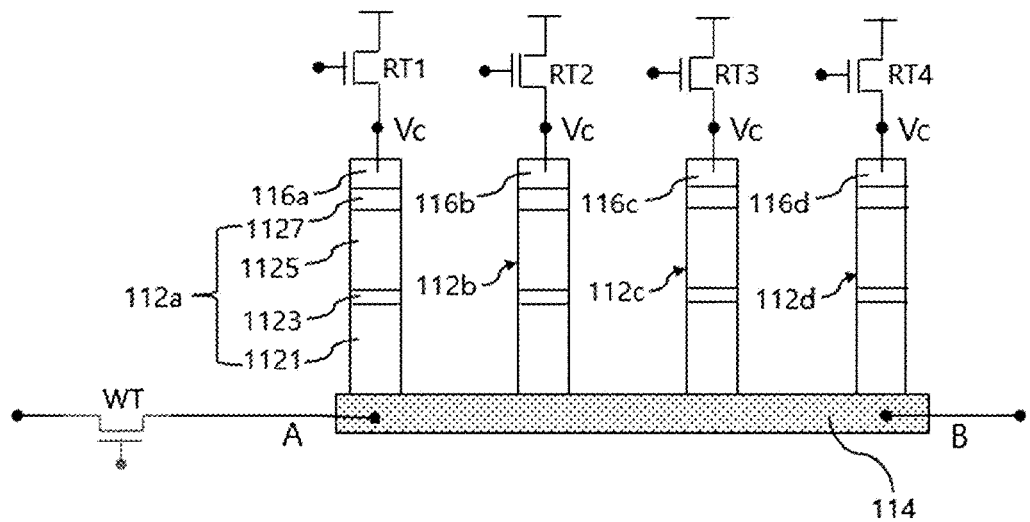

FIGS. 4 and 5 are diagrams necessary to describe read operation of each of the first to fourth unit weighting elements 112a to 112d illustrated in FIG. 1.

With reference to FIG. 4, in a state where the write drive transistor WT is turned off, the first to fourth read drive transistors RT1 to RT4 are all turned on. At this point, the control voltage Vc at a level corresponding to the read control voltage Vr is applied. Then, a read control voltage Vr is applied to the first to fourth control electrodes 116a to 116d through the first to fourth read drive transistors RT1 to RT4, respectively.

Next, current flowing through the first to fourth unit weighting elements 112a to 112d is measured. In a state where the first to fourth read drive transistors RT1 to RT4 are all turned on, the first to fourth unit weighting elements 112a to 112d operate as resistors connected in parallel between the bit line BL and the source line SL. For this reason, in a case where resistances or voltages of the first to fourth unit weighting elements 112a to 112d are measured, the synapse weight is difficult to measure at equal intervals.

That is, the respective resistances of the first to fourth unit weighting elements 112a to 112d are defined as Ra, Rb, Rc, and Rd, respectively, a total $R_{tot}$ of all the resistances is expressed as in following Equation 1.

$$\frac{1}{R_{tot}} = \frac{1}{R_a} + \frac{1}{R_b} + \frac{1}{R_c} + \frac{1}{R_d} \qquad \text{Equation 1}$$

By contrast, current flowing through each of the first to fourth unit weighting elements 112a to 112d is in proportion to conductance, that is, 1/R. Therefore, a total $I_{tot}$ of amounts of current flowing through each of the first to fourth unit weighting elements 112a to 112d is expressed as in following Equation 2.

$$\frac{V_c}{R_{tot}} = \frac{V_c}{R_a} + \frac{V_c}{R_b} + \frac{V_c}{R_c} + \frac{V_c}{R_d} \qquad \text{Equation 2}$$

$$I_{tot} = I_a + I_b + I_c + I_d$$

At this point, a tunnel magnetoresistance (TMR) of each of the first to fourth unit weighting elements 112a to 112d is expressed in following Equation 3.

$$TMR = \frac{R_{AP} - R_P}{R_P} \qquad \text{Equation 3}$$

where $R_{AP}$ is a resistance value that results when the magnetization direction is anti-parallel and $R_P$ is a resistance value that results when the magnetization direction is parallel. Therefore, a resistance value that results when the magnetization direction is anti-parallel is expressed as in following Equation 4.

$$R_{AP} = R_P \times (1 + TMR) \qquad \text{Equation 4}$$

The first to fourth unit weighting elements 112a to 112d according to the first embodiment of the present disclosure has different resistance values. Therefore, the resistance of each of the first to fourth unit weighting elements 112a to 112d along the magnetization direction and current that flows when the control voltage Vc at a level corresponding to the read control voltage Vr is applied are expressed in following Table 1.

TABLE 1

| Unit weighting element | Resistance Parallel (P) | Anti-parallel | Current |
|---|---|---|---|
| 112a | R | R × (1 + TMR) | $\frac{Vr}{R \times (1 + TMR)}$ |
| 112b | 2R | 2R × (1 + TMR) | $\frac{Vr}{2R \times (1 + TMR)}$ |
| 112c | 4R | 4R × (1 + TMR) | $\frac{Vr}{4R \times (1 + TMR)}$ |
| 112d | 8R | 8R × (1 + TMR) | $\frac{Vr}{8R \times (1 + TMR)}$ |

At this point, in a case where the synapse weight is expanded to n bits, a resistance of each of the n unit weighting elements and current that flows when the control voltage Vc at a level corresponding to the read control voltage Vr is applied are expressed in following Table 2.

TABLE 2

| Resistance | | |
| --- | --- | --- |
| Parallel (P) | Anti-parallel | Current |
| $2^{n-1}R$ | $2^{n-1} \times R \times (1 + TMR)$ | $\dfrac{Vr}{2^{n-1} \times R \times (1 + TMR)}$ |

Therefore, a total of amounts of current flowing through each of the first to fourth unit weighting elements 112a to 112d can be expressed according to the magnetization direction as in FIG. 5. That is, the total of amounts of current flowing through each of the first to fourth unit weighting elements 112a to 112d can be defined as in following Equation 5.

$$\frac{15 + (x) \times TMR}{8R \times (1 + TMR)} \qquad \text{Equation 5}$$

where × is a value that results from converting a binary number into a decimal number. For example, when the synapse weight is "0010", the decimal number of "0010" is 3. Therefore, × corresponds to 3. When the synapse weight is expanded to n bits, the total of amounts of current through each of n unit weighting elements is expressed as in following Equation 6.

$$\frac{(2^n - 1) + (x) \times TMR}{2^{n-1} \times R \times (1 + TMR)} \qquad \text{Equation 6}$$

Therefore, when the synapse weight is read out using the total of amounts of current flowing through each of the first to fourth unit weighting elements 112a to 112d, the synapse weight can be read out at equal intervals. In addition, the synapse weight can be expressed in terms of $2^n$ levels arranging from 0 to $2^{n-1}$, and the synapse weights stored in the first to fourth unit weighting elements 112a to 112d, respectively, can be read out at a time. For this reason, the read operation can be performed at a high speed.

During the read operation, the respective resistances of the first to fourth unit weighting elements 112a to 112d are different from each other. For this reason, the following method is necessary in order to apply the read control voltage V having the same magnitude to the first to fourth unit weighting elements 112a to 112d. For example, in a case where the first to fourth read drive transistors RT1 to RT4 are realized as the same types of transistors, respectively, voltages may be applied to gates, respectively, of the first to fourth read drive transistors RT1 to RT4 in such a manner that first to fourth bit selection signals SR1 to SR4 have different voltage levels.

Specifically, voltages may be applied in such a manner that the first to fourth bit selection signals SR1 to SR4 have different voltage levels according to the resistances, respectively, of the first to fourth unit weighting elements 112a to 112d. In terms of a structural relationship, the first to fourth read drive transistors RT1 to RT4 are connected in series to the corresponding first to fourth unit weighting elements 112a to 112d, respectively, between the bit line BL and the source line SL. Therefore, voltages between drain and source terminals of the first read drive transistor RT1, between drain and source terminals of the second read drive transistor RT2, between drain and source terminals of the third read drive transistor RT3, and between drain and source terminals of the fourth read drive transistor RT4 are distributed according to resistances, respectively, of the first to fourth unit weighting elements 112a to 112d.

The respective resistances of the first to fourth read drive transistors RT1 to RT4 change in a non-linear manner according to the voltages, respectively, that are applied to the respective gates thereof. For this reason, voltages of which the levels are lowered as the respective resistances of the first to fourth unit weighting elements 112a to 112d increases are applied to the gates of the corresponding first to fourth read drive transistors RT1 to RT4, respectively, the same voltage may be applied to opposite terminals of each of the first to fourth unit weighting elements 112a to 112d during the read operation.

In addition to this method, the following method may be employed. The first to fourth read drive transistors RT1 to RT4 may be manufactured in such a manner that sizes thereof are different from each other. Then, the same voltages may be applied to opposite terminals of each of the first to fourth unit weighting elements 112a to 112d. The greater an area of a MOSFET, the lower an ON resistance of the MOSFET. Therefore, the MOSFET may be manufactured in such a manner that the higher the resistance of each of the first to fourth unit weighting elements 112a to 112d, the lower a ratio of a width W of each of the corresponding first to fourth read drive transistors RT1 to RT4 to a length L thereof, that is, a W-to-L ratio.

Figure 6:
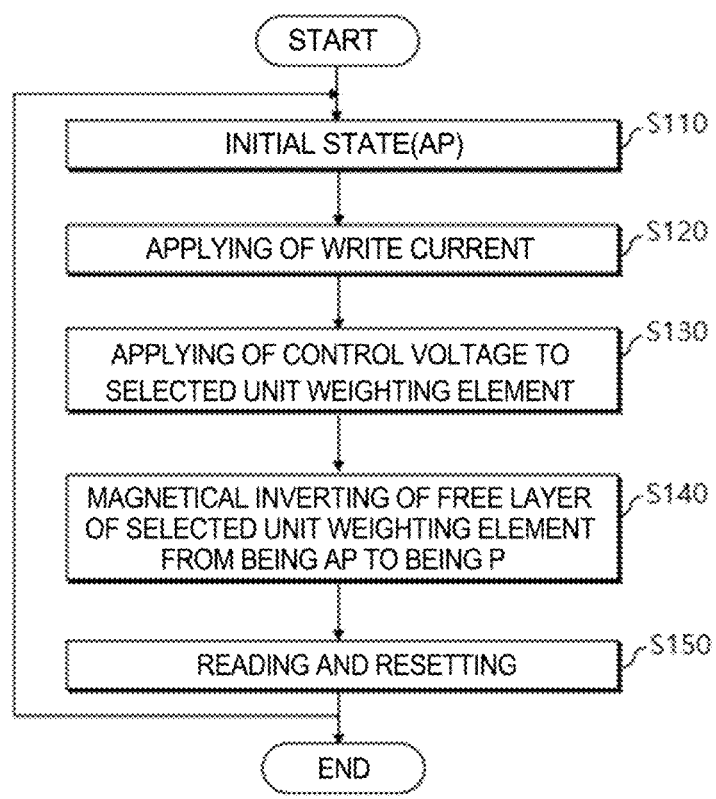
FIG. 6 is a flowchart illustrating a method of driving a neuromorphic device according to a second embodiment of the present disclosure.

FIG. 6 is a flowchart illustrating a method of driving a neuromorphic device according to a second embodiment of the present disclosure.

Figure 7:
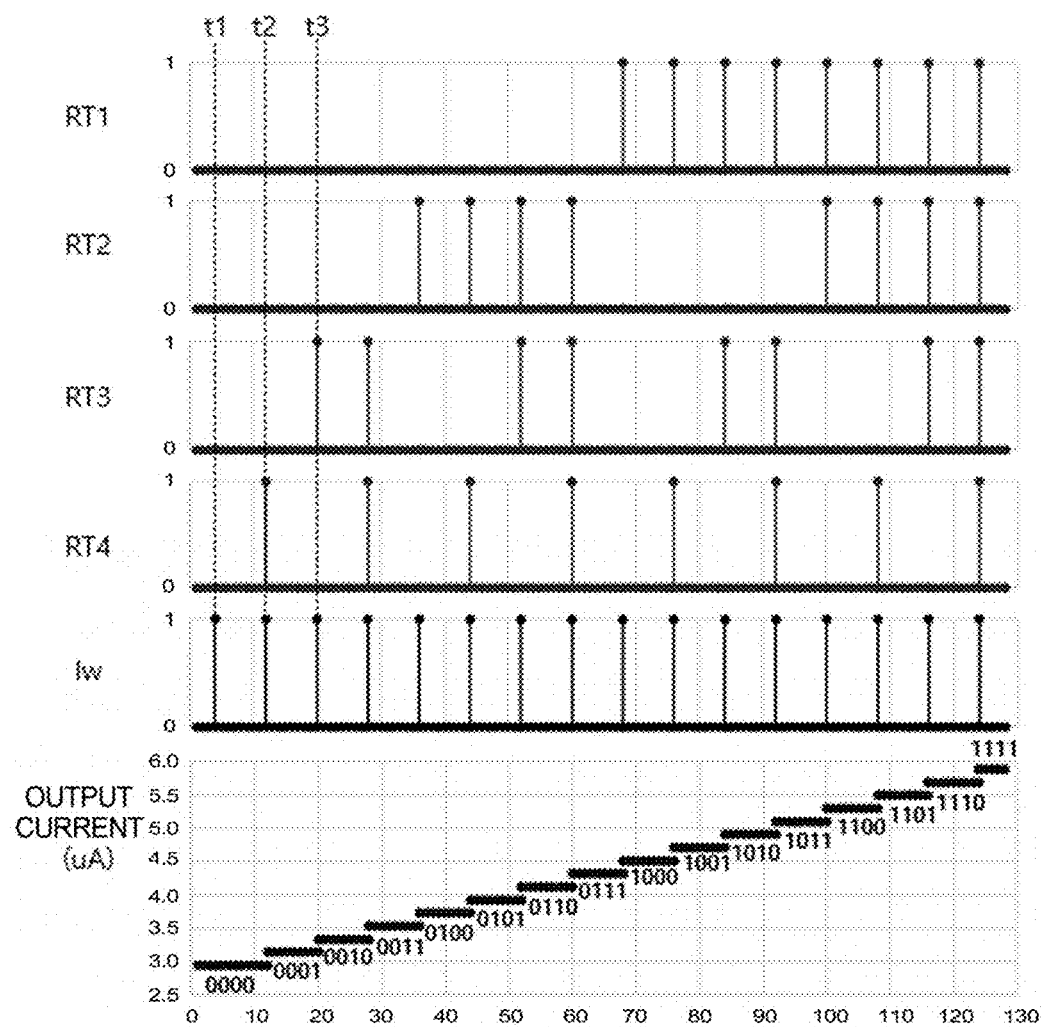
FIG. 7 is a timing chart illustrating the method of driving a neuromorphic device according to the second embodiment of the present disclosure.

FIG. 7 is a timing chart illustrating the method of driving a neuromorphic device according to the second embodiment of the present disclosure.

With reference to FIGS. 6 and 7, the method of driving a neuromorphic device according to the second embodiment of the present disclosure is described, taking as example a case where a reset operation is performed after the write operation and where a next-time write operation is performed. Specifically, first, when a write signal SW at a high level is applied at first write point in time t1, the write drive transistor WT is turned on. Thus, the positive (+) write current +Iw flows through the electrode 114 in the direction from the first terminal A to the second terminal B. At this point, the positive (+) write current +Iw may be set to a magnitude corresponding to a value of the switching threshold current that varies with the write control voltage Vw.

The first to fourth bit selection signals SR1 to SR4 are in a low-level state. Therefore, the first to fourth read drive transistors RT1 to RT4 are kept turned off, and the value of the switching threshold current of each of the first to fourth unit weighting elements 112a to 112d does not change.

Therefore, the free layer 1121 of each of the first to fourth unit weighting elements 112a to 112d is not magnetically inverted, and the magnetization direction is maintained as initially set (S110). For example, a case where the magnetization direction of the free layer 1121 is initially set to be in anti-parallel (AP) with the magnetization direction of the fixed layer 1125 is described.

Next, when the write signal SW at a high level is applied at second write point in time t2, the write drive transistor WT is turned on. Thus, the positive (+) write current +Iw flows through the electrode 114 in the direction from the first terminal A to the second terminal B (S120). At this time, when the fourth bit selection signal SR4 at a high level is applied, the fourth read drive transistor RT4 is turned on. Thus, the control voltage Vc at a level corresponding to the write control voltage Vw is applied to the fourth control electrode 116d (S130).

The write control voltage Vw is applied between the free layer 1121 and the fixed layer 1125 of the fourth unit weighting element 112d. Thus, the magnetic anisotropic energy is lowered, and accordingly, the switching threshold current is lowered. Then, the magnetization direction of the free layer 1121 of the fourth unit weighting element 112d is magnetically inverted in parallel with the magnetization direction of the fixed layer 1125 (S140). Therefore, the synapse weight is stored as "0001".

Next, the synapse weight stored in the synapse weighting element 110 is read out and then is reset to an initial state (S150). The MTJ is a non-volatile element. Data input into the MTJ, when stored once, is kept stored until next data are input. Therefore, in the second embodiment of the present disclosure, each time the write signal SW at a high level is applied to finish performing the write operation of storing the synapse weight, the read operation of reading out the synapse weight stored in the synapse weighting element 110 is performed before starting the next write operation. Then, the synapse weight stored in the synapse weighting element 110 can be initialized.

Next, returning to Step S110 takes place, and then Step S110 and subsequent steps are repeated. Thus, the synapse weight can be stored. That is, when the write signal SW at a high level is applied at third write point in time t3, the write drive transistor WT is turned on. Thus, the positive (+) write current +Iw flows through the electrode 114 in the direction from the first terminal A to the second terminal B.

At this time, when the third bit selection signal SR3 at a high level is applied, the third read drive transistor RT3 is turned on. Thus, the control voltage Vc at a level corresponding to the write control voltage Vw is applied to the third control electrode 116c. Then, the magnetization direction of the free layer 1121 of the third unit weighting element 112c is magnetically inverted in parallel with the magnetization direction of the fixed layer 1125. Therefore, the synapse weight is stored as "0010".

Figure 8:
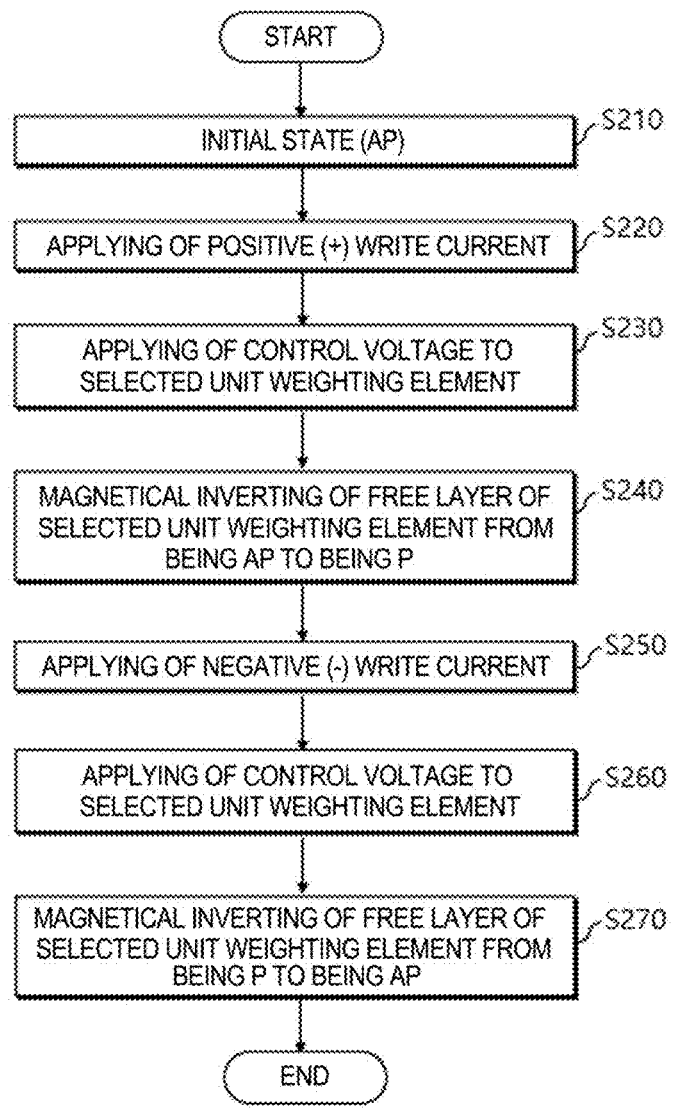
FIG. 8 is a flowchart illustrating a method of driving a neuromorphic device according to a third embodiment.
Figure 9:
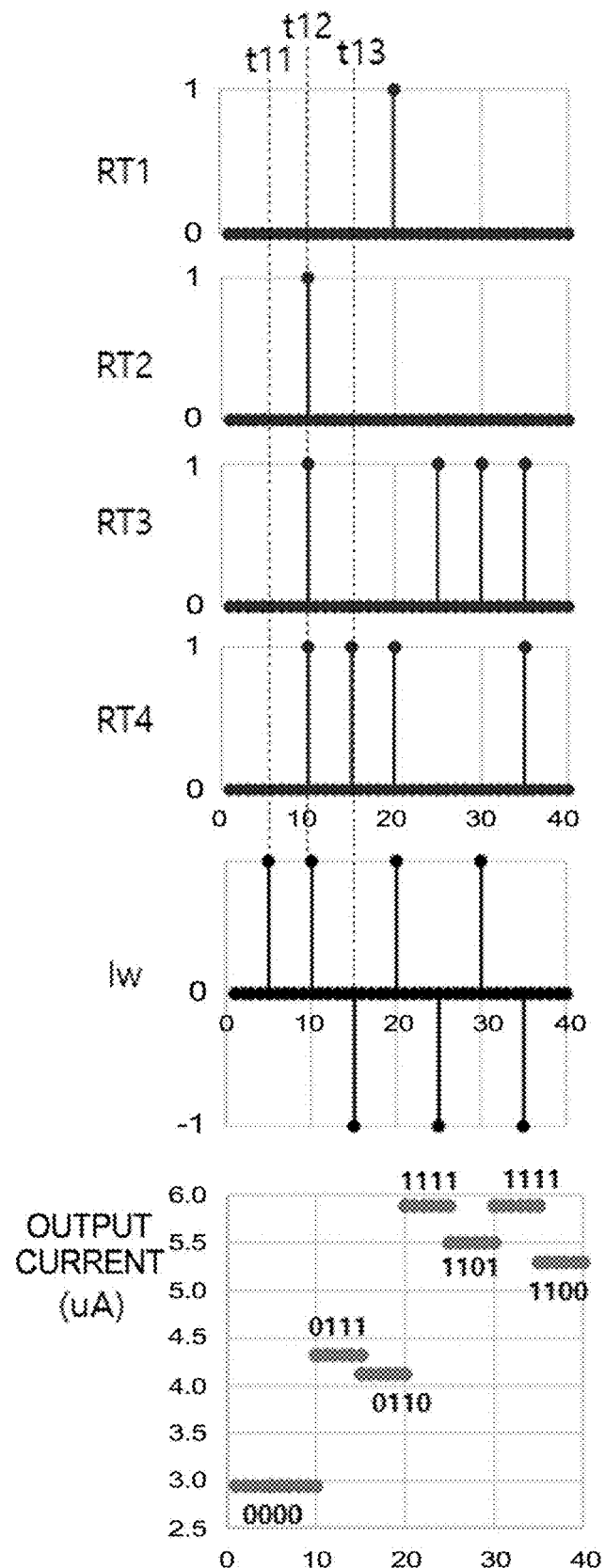
FIG. 9 is a timing diagram illustrating the method of driving a neuromorphic device according to the third embodiment.

FIG. 8 is a flowchart illustrating a method of driving a neuromorphic device according to a third embodiment. FIG. 9 is a timing diagram illustrating the method of driving a neuromorphic device according to the third embodiment.

In the method of driving a neuromorphic device according to the third embodiment of the present disclosure, unlike in the method according to the second embodiment of the present disclosure, a next write operation is performed, without performing the reset operation, after performing the write operation. This case is described with reference to FIGS. 8 and 9. First, when the write signal SW at a high level is applied at first write point in time t11, the write drive transistor WT is turned on. Thus, the positive (+) write current +Iw flows through the electrode 114 in the direction from the first terminal A to the second terminal B. At this point, the positive (+) write current +Iw may be set to a magnitude corresponding to a value of the switching threshold current that varies with the write control voltage Vw.

The first to fourth bit selection signals SR1 to SR4 are in a low-level state. Therefore, the first to fourth read drive transistors RT1 to RT4 are kept turned off, and the value of the switching threshold current of each of the first to fourth unit weighting elements 112a to 112d does not change.

Therefore, the free layer 1121 of each of the first to fourth unit weighting elements 112a to 112d is not magnetically inverted, and the magnetization direction is maintained as initially set (S210). For example, a case where the magnetization direction of the free layer 1121 is initially set to be in anti-parallel (AP) with the magnetization direction of the fixed layer 1125 is described.

Next, when the write signal SW at a high level is applied at second write point in time t12, the write drive transistor WT is turned on. Thus, the positive (+) write current +Iw flows through the electrode 114 in the direction from the first terminal A to the second terminal B (S220). At this time, when the second to fourth bit selection signals SR2 to SR4 at a high level are applied, the second to fourth read drive transistors RT2 to RT4 are turned on. Thus, the control voltage Vc at a level corresponding to the write control voltage Vw is applied to each of the second to fourth control electrodes 116b to 116d (S230).

The write control voltage Vw is applied between the free layer 1121 and the fixed layer 1125 of each of the second to fourth unit weighting elements 112b to 112d. Thus, the magnetic anisotropic energy is lowered, and accordingly, the switching threshold current is lowered. Then, the magnetization direction of the free layer 1121 of each of the second to fourth unit weighting elements 112b to 112d is magnetically inverted in parallel with the magnetization direction of the fixed layer 1125 (S240). Therefore, the synapse weight is stored as "0111".

Next, the write signal SW at a high level is applied to third write point in time t13, and thus the write drive transistor WT is turned on. At this point, in the third embodiment of the present disclosure, unlike in the second embodiment of the present disclosure, without resetting the previously stored synapse weight, the negative (−) write current −Iw is applied to the electrode 114 in the direction from the second terminal B to the first terminal A in order to store a data of "0" in the fourth unit weighting element 112d (S250).

Then, the fourth bit selection signal SR4 at a high level is applied, and thus the fourth read drive transistor RT4 is turned on. Thus, the control voltage Vc at a level corresponding to the write control voltage Vw is applied to the fourth control electrode 116d (S260). Then, the magnetization direction of the free layer 1121 of the fourth unit weighting element 112d is magnetically inverted in anti-parallel with the magnetization direction of the fixed layer 1125 (S270). Therefore, the synapse weight is stored as "0110".

In this manner, in a case of storing data different from the previously stored data in a specific bit of the synapse weight without performing the reset operation, the synapse weight can be stored by controlling a direction of the write current Iw. In a state where the synapse weight is stored as "1101", if "0110" is to be stored, the first and fourth bit have to change from "1" to "0". Therefore, each of the first and fourth unit weighting element 112a, 112d have to be magnetically inverted from a parallel state to an anti-parallel state. Furthermore, the third bit has to change from "0" to "1". Therefore, the third unit synapse element 112c has to be magnetically inverted from an anti-parallel state to a parallel state. Therefore, in this situation, the write operation is performed two times, and thus the synapse weight can be stored.

Figure 10A:
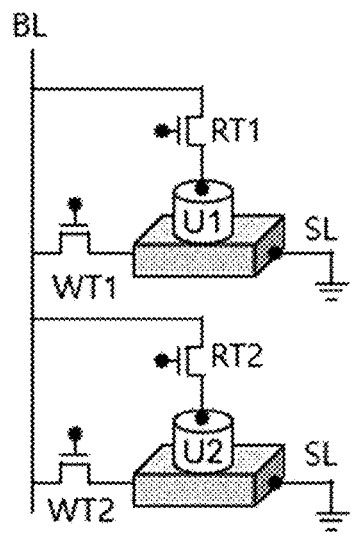
FIGS. 10A and 10B are diagrams each illustrating a comparative example of the neuromorphic device according to the first embodiment of the present disclosure.
Figure 10B:
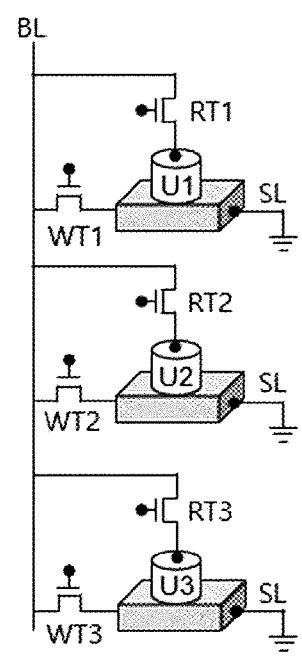
Figure 11:
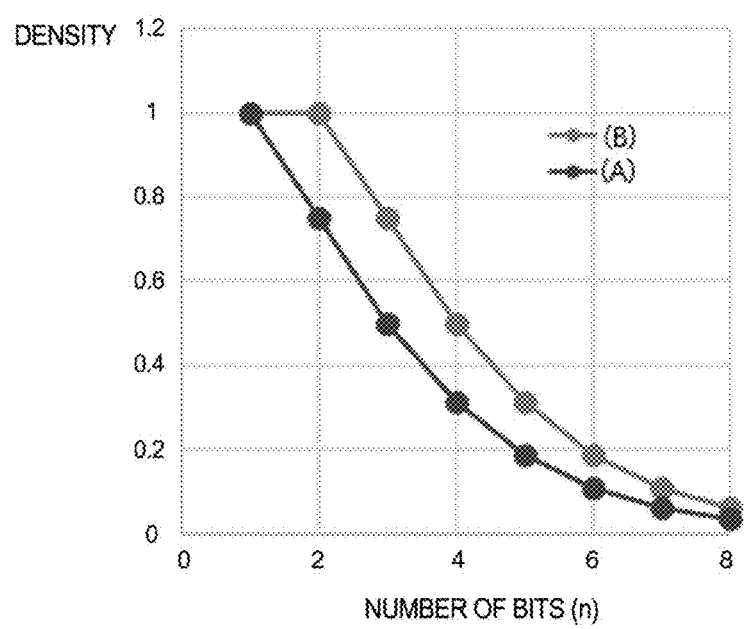
FIG. 11 is a graph for comparing a density of an implementation example of the neuromorphic device according to the first embodiment of the present disclosure and a density of the comparative example.

FIGS. 10A and 10B are diagrams each illustrating a comparative example B of the neuromorphic device 100 according to the first embodiment of the present disclosure. FIG. 11 is a graph for comparing a density of an implementation example A of the neuromorphic device 100 according to the first embodiment of the present disclosure and a density of the comparative example B.

With reference to FIG. 1, the neuromorphic device 100 according to the embodiment of the present disclosure needs to include a unit synapse element and a read drive transistor in order to correspond to each bit of the synapse weight. The neuromorphic device 100 according to the first embodiment of the present disclosure employs a structure in which a plurality of unit synapse elements are arranged on the top of one electrode. Therefore, in a case where a 2-bit synapse weight is to be stored, two unit synapse elements 112a and 112b and three transistors WT, RT1, and RT2 are necessary. In addition, in a case where a 3-bit synapse weight is to be stored, three unit synapse elements 112a to 112c and four transistors WT, and RT1 to RT3 are necessary.

By contrast, the comparative example B employs a structure in which one unit synapse element having a 2T-1M structure is arranged on the top of one electrode on a one-to-one basis. One unit synapse element is capable of storing one-bit data. Therefore, as illustrated in FIG. 10A, in a case where a two-bit synapse weight is stored, four transistors WT1, WT2, RT1, and RT2 and two unit synapse elements U1 and U2 are necessary. In addition, as illustrated in FIG. 10B, in a case where a three-bit synapse weight is stored, six transistors WT1 to WT3 and RT1 to RT3 and three unit synapse elements U1 to U3 are necessary.

Result of comparing the density of the implementation example A of the neuromorphic device 100 according to the first embodiment of the present disclosure and the density of the comparative example B of the neuromorphic device 100 are shown in FIG. 11. Normally, the unit synapse is manufactured in such a manner that the density thereof is approximately 10% of the density of the transistor. Therefore, an area of the neuromorphic device is determined by the number of transistors. In the comparative example B, 2n transistors are necessary for a n-bit synapse weight. By contrast, in the implementation example A of the neuromorphic device 100 according to the embodiment of the present disclosure, (n+1) transistors are necessary. Therefore, the advantage of the implementation example A over the comparative example B is that an area of the transistors in the implementation example A is decreased. Thus, an integration density can be increased.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. A neuromorphic device comprising:
an electrode including a first terminal connected to a bit line through a write drive transistor and a second terminal connected to a source line;
a plurality of unit weighting elements having different resistance values, each of the plurality of unit weighting elements comprising a free layer arranged on the top of the electrode, a tunnel barrier layer arranged on the top of the free layer, and a fixed layer arranged on the top of the tunnel barrier layer, and corresponding to each bit of a synapse weight; and
a plurality of control electrodes connected to the bit line through a plurality of read drive transistors, respectively, a control voltage being applied between the free layer and the fixed layer of each of the plurality of unit weighting elements through each of the plurality of control electrodes.

2. The neuromorphic device of claim 1, wherein a resistance ratio between the plurality of unit weighting elements is $2^n$ times.

3. The neuromorphic device of claim 2, wherein each of the plurality of unit weighting elements varies in area with the resistance value.

4. The neuromorphic device of claim 2, wherein the tunnel barrier layer of each of the plurality of unit weighting elements varies in thickness with the resistance value.

5. The neuromorphic device of claim 1, wherein, among the plurality of unit weighting elements, the unit weighting element having the lowest resistance value corresponds to the most significant bit of the synapse weight, and the unit weighting element having the highest resistance value corresponds to the most insignificant bit of the synapse weight.

6. The neuromorphic device of claim 1, wherein in a state where the write drive transistor is turned on, when the corresponding read drive transistor is turned on among the plurality of read drive transistors, the control voltages are applied to the plurality of unit weighting elements through the plurality of control electrodes, respectively, and thus a value of switching threshold current for changing a magnetization direction of the free layer is changed, and
wherein when the value of the switching threshold current is changed, due to write current flowing between the first and second terminals of the electrode, the magnetization direction of the free layer is changed in a manner that is opposite to a previously stored magnetization direction.

7. The neuromorphic device of claim 1, wherein in a state where the write drive transistor is turned off, when the plurality of read drive transistors are turned on, the control voltages having the same magnitude are applied to the plurality of unit weighting elements through the plurality of control electrodes, respectively, and thus a total of amounts of current flowing between the free layer and the fixed layer of each of the plurality of unit weighting elements is read out as the synapse weight.

8. A method of driving a neuromorphic device comprising an electrode, a plurality of unit weighting elements having different resistance values, each of the plurality of unit weighing elements comprising a free layer arranged on the top of the electrode, a tunnel barrier layer arranged on the top of the free layer, and a fixed layer arranged on top of the tunnel barrier layer, and corresponding to each bit of a synapse weight, and a plurality of control electrodes, a control voltage being applied between the free layer and the fixed layer of each of the plurality of unit weighting elements through each of the plurality of control electrodes, the method comprising:
applying write current to the electrode;
applying the control voltage to at least one selected from among the plurality of control electrodes and thus changing a value of switching threshold current of the unit weight element; and
changing a magnetization direction of the free layer of the unit weighting element, a value of whose switching threshold current is changed due to the write current and thus storing the synapse weight.

9. The method of claim 8, wherein a resistance ratio between the plurality of unit weighting elements is $2^n$ times.

10. The method of claim 8, wherein, among the plurality of unit weighting elements, the unit weighting element having the lowest resistance value corresponds to the most significant bit of the synapse weight, and the unit weighting element having the highest resistance value corresponds to the most insignificant bit of the synapse weight drive.

11. The method of claim 8, wherein in a case where a data stored in the unit weighting element is opposite to a data to be currently stored, the write current is applied to the electrode in a direction opposite to a direction of immediately preceding application of the write current.

12. The method of claim 8, further comprising:
blocking the write current from flowing to the electrode;
applying the control voltages having the same magnitude to the plurality of control electrodes, respectively; and
determining the synapse weight by reading out a total of amounts of current flowing between the free layer and the fixed layer of each of the plurality of unit weighting elements.

* * * * *